(12) United States Patent
Grodzki et al.

(10) Patent No.: US 11,693,077 B2
(45) Date of Patent: Jul. 4, 2023

(54) IDENTIFYING RADIO FREQUENCY INTERFERENCE IN A MAGNETIC RESONANCE SYSTEM

(71) Applicant: Siemens Healthcare GmbH, Erlangen (DE)

(72) Inventors: David Grodzki, Erlangen (DE); Stephan Kannengießer, Wuppertal (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/679,422

(22) Filed: Feb. 24, 2022

(65) Prior Publication Data

US 2022/0308146 A1 Sep. 29, 2022

(30) Foreign Application Priority Data

Mar. 23, 2021 (EP) .................................. 21164156

(51) Int. Cl.
*G01R 33/565* (2006.01)
*G01R 33/483* (2006.01)
*G01R 33/54* (2006.01)

(52) U.S. Cl.
CPC ......... *G01R 33/565* (2013.01); *G01R 33/483* (2013.01); *G01R 33/543* (2013.01); *G01R 33/5659* (2013.01)

(58) Field of Classification Search
CPC .. G01R 33/565; G01R 33/483; G01R 33/543; G01R 33/5659
See application file for complete search history.

(56) References Cited

U.S. PATENT DOCUMENTS

| | | | |
|---|---|---|---|
| 2003/0193335 A1* | 10/2003 | Patch | G01R 33/565 324/309 |
| 2008/0157767 A1* | 7/2008 | Bammer | G01R 33/4824 382/128 |
| 2017/0184694 A1* | 6/2017 | Li | G01R 33/5616 |
| 2020/0191893 A1 | 6/2020 | Grodzki | |
| 2020/0249292 A1 | 8/2020 | Biber et al. | |
| 2021/0025954 A1 | 1/2021 | Biber et al. | |

FOREIGN PATENT DOCUMENTS

| | | | | |
|---|---|---|---|---|
| WO | 2019068687 A2 | 4/2019 | | |
| WO | WO-2021064194 A1 * | 4/2021 | ......... | G01R 33/5608 |

* cited by examiner

*Primary Examiner* — Rishi R Patel
(74) *Attorney, Agent, or Firm* — Lempia Summerfield Katz LLC

(57) ABSTRACT

Methods and systems are provided for identifying radio frequency (RF) interference without an RF room during imaging in a magnetic resonance tomography system. The method includes performing an acquisition, wherein scanning of a k-space along a trajectory takes place and an angle of rotation α exists between a scan start position of a first individual acquisition and a scan start position of a following second individual acquisition. A first image is obtained from the first individual acquisition and a second image is obtained from the second individual acquisition. One of the two images is rotated in respect of the other image about the angle of rotation α. A correlation is determined between the one rotated image and the other image, and a point of interference is identified from the correlation.

18 Claims, 2 Drawing Sheets

| | |
|---|---|
| 1 MRT system | 21 Gradient controller |
| 2 Longitudinal direction | 22 Radio frequency unit |
| 10 Magnetic unit | 23 Controller |
| 11 Field magnet | 25 Signal bus |
| 12 Gradient coils | 30 Patient couch |
| 14 Body coil | 33 Connection line |
| 16 Patient tunnel | 36 Positioning unit |
| 20 Control unit | 50 Local coil |
| | 100 Patient |

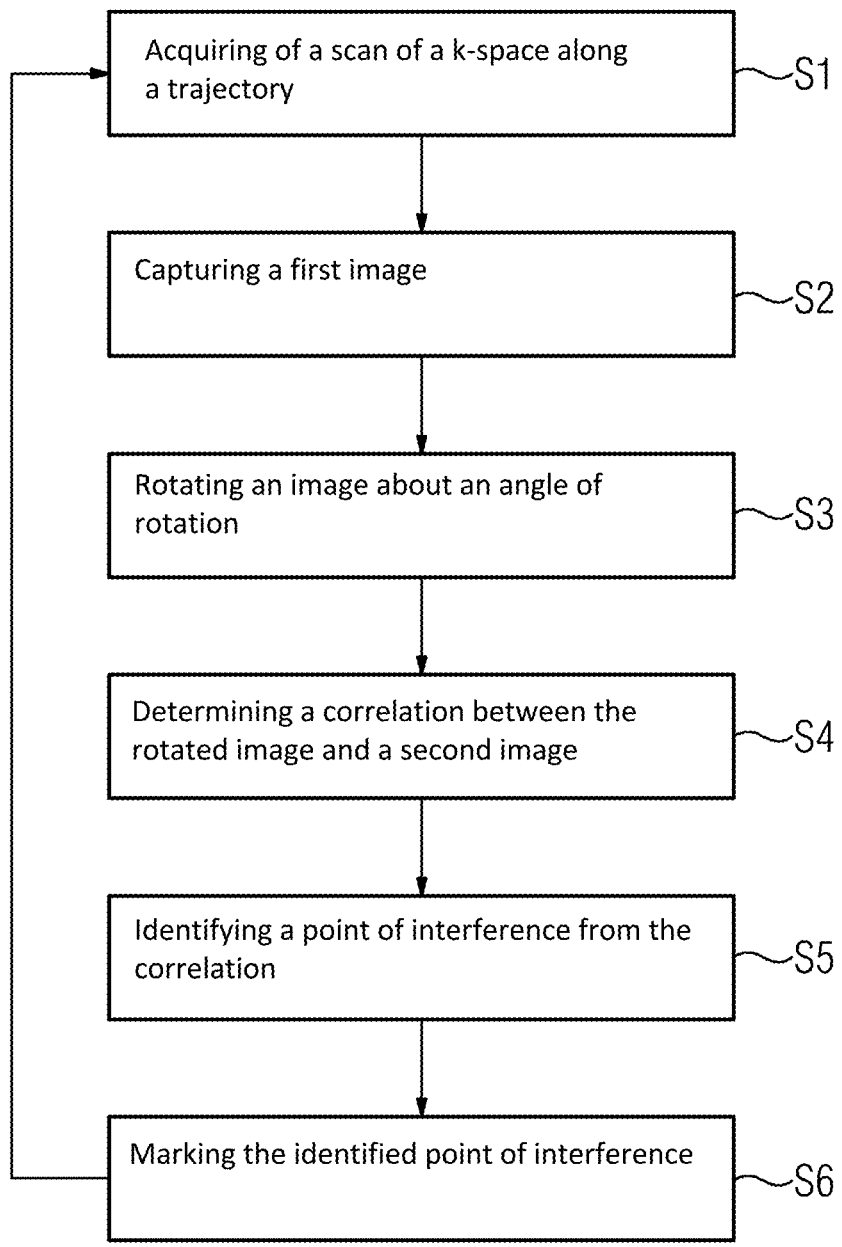

IDENTIFYING RADIO FREQUENCY INTERFERENCE IN A MAGNETIC RESONANCE SYSTEM

The present patent document claims the benefit of European Patent Application No. 21164156.8, filed Mar. 23, 2021, which is hereby incorporated by reference in its entirety.

TECHNICAL FIELD

The present disclosure relates to a method for identifying radio frequency (RF) interference during imaging of a magnetic resonance tomography system by performance of an acquisition, in which a scan is taken of a k-space along a trajectory, wherein an angle exists between a scan start position of a first individual acquisition and a scan start position of a following second individual acquisition, and a first image is obtained from the first individual acquisition and a second image from the second individual acquisition. In addition, the present disclosure relates to a computer program product. The present disclosure further relates to a magnetic resonance tomography system for identifying RF interference during imaging with a tomography device and an image processing device for the performance of the acquisitions and image captures.

BACKGROUND

Systems for magnetic resonance tomography (MRT) are imaging apparatuses which in order to map an object under examination align nuclear spins of the object under examination with a strong external magnetic field and excite them to precession about the corresponding alignment using a magnetic alternating field. The precession or the return of the spins from this excited state into a state with less energy in turn generates a magnetic alternating field in response, which may be detected using receiving antennas.

With the help of magnetic gradient fields, a position encoding may be imposed on the signals and subsequently enables an assignment from the received signal to a volume element of the object under examination. The received signal may then be evaluated, for example, in order to provide a three-dimensional imaging representation of the object under examination. Local receiving antennas (known as local coils) may be used as receiving antennas, and may be arranged directly on the object under examination to achieve a better signal-to-noise ratio (SNR). The receiving antennas may also be arranged in the area surrounding the object under examination or may be installed in a patient couch.

The MRT signals to be received for the imaging are extremely weak, so that in the case of known MRT systems, shielding against external interference signals is necessary in order to achieve a sufficient SNR. Expensive shielded rooms are in particular installed for this purpose in order to reduce the interference immissions. This results in significant costs and structural limitations because of the corresponding space requirement.

Document WO 2019/068687 A2 describes a magnetic resonance tomography system with active interference suppression and a corresponding method. In this case, a first receiving antenna is provided for receiving a magnetic resonance signal from a patient and a second receiving antenna for receiving an interference signal. A receiver connected to the receiving antennas is configured to suppress the interference signal received with the second receiving antenna in the magnetic resonance signal received from the first receiving antenna. To this end, the interference signal is determined during the MRT sequences for signal acquisition, wherein time periods may be used in which no MRT signal is expected for imaging. An interference suppression controller may combine the signals from the first receiving coil and the second receiving coil in a weighted manner, in order to minimize the energy of the interference signal in the combined signal.

Document US 2021/025954 A1 describes a method for suppressing an interference signal during image acquisition with a magnetic resonance tomography scanner that has an antenna and an interference signal sensor. The magnetic resonance tomography scanner receives a reference interference signal via the interference signal sensor, receives a magnetic resonance signal via the antenna, and reduces a portion of an interference signal in the magnetic resonance signal as a function of the reference interference signal. During the reduction, the method takes into account the fact that the reference interference signal also has a portion of the magnetic resonance signal. Because these portions differ in length depending on the MRT sequence used and occur at different times, the interference suppression procedure is adapted individually to each MRT sequence, resulting in increased costs. Furthermore, depending on the MRT sequence the portions available for determining the interference signal may not be sufficiently long in order to achieve a reliable suppression of the effect of the interference.

Current MRT systems may be surrounded by the aforementioned shielded room or RF room. This is firstly intended to exclude RF interference sources penetrating from outside which would impede the MR scan, and secondly to prevent the RF radiation applied by the MRT from penetrating to the outside and interfering with other devices. However, the present document specifically deals with the identification and elimination of interference which acts on the MR scan from the outside. The structure of an RF room in this regard may be complex and associated with high costs.

Furthermore, approaches exist (not verifiable in printed publications) which deal with the question of whether or how an MRT system may be operated without an RF room. In this regard, most methods rely on additional antennas in the vicinity of the MRT system, known as pick-up antennas.

SUMMARY AND DESCRIPTION

The object of the present disclosure is to propose a method for identifying RF interference sources in magnetic resonance tomography systems, wherein RF rooms are dispensed with, and improved identification of interference is nevertheless possible.

The scope of the present disclosure is defined solely by the appended claims and is not affected to any degree by the statements within this summary. The present embodiments may obviate one or more of the drawbacks or limitations in the related art.

According to the disclosure, a method for identifying RF interference during imaging by a magnetic resonance tomography system is hence provided. RF interference, in other words radio frequency interference, here refers to interference, the original frequencies of which are greater than 1 kHz and which may become noticeable during imaging by a magnetic resonance tomography system. In particular, RF interference such as this is frequently responsible for artifacts on the MRT images captured. Specifically, this RF interference may become noticeable as dots, lines, etc. in the images captured.

In a first act, an acquisition is conducted in which scanning of a k-space (phase encoding via the frequency encoding) takes place along a trajectory, wherein an angle of rotation $\alpha$ exists between a scan start position of a first individual acquisition and a scan start position of a following second individual acquisition. An acquisition may include multiple individual acquisitions. The second individual acquisition mentioned may follow on directly from the first individual acquisition. In certain examples, one or more individual acquisitions may also take place between the first and the second individual acquisition.

Scanning of the k-space takes place during the acquisition by the magnetic resonance tomography system. The acquisition includes multiple individual acquisitions, in which scans are taken along a respective trajectory. The scan start positions of the trajectories of the individual acquisitions are rotated toward one another about an angle of rotation $\alpha$. The result is that the images captured during the individual acquisitions are likewise rotated toward one another about the angle of rotation $\alpha$.

In a further method act, a first image is obtained or generated from the first individual acquisition and a second image is obtained or generated from the second individual acquisition. Datasets are created for each individual acquisition, from which respective images may be obtained. These respective images may be obtained or generated using known algorithms of the image processing for magnetic resonance tomography systems.

One of the two images is now rotated in respect of the other image about the angle of rotation $\alpha$. Thus, the first image from the first individual acquisition is rotated in respect of the second image from the second individual acquisition or vice versa. The rotation takes place about precisely the same angle of rotation $\alpha$, but may be in the reverse direction. This means that the rotation in the image plane is in practice reversed, in that, for example, the second image is "rotated back." During this rotation or back-rotation, the positions of individual components of the object also rotate about the same axis of rotation.

A correlation is then determined between the one rotated image and the other image. Correlation here means any relationship between the two images. Such a relationship may be seen when certain image components of the individual images are moved toward one another and others away from one another during the rotation. For example, if an object component is represented in both images, it is located in different image positions because of the rotation of the scan start positions in both images. Hence, if the images are rotated toward one another such that their edges are congruent, (e.g., rotated toward one another about the angle of rotation $\alpha$), the corresponding image points of the same object component move apart from one another. The behavior is different in the case of interference. This may occur at a fixed image position. This means that when the individual images are rotated toward one another such that the edges of the images are congruent, the interference or artifacts are moved toward one another and lie on top of one another or occupy the same image position. This means that a point of interference from the correlation resulting from the two images may be identified. Thus, whereas in the images rotated toward one another the image components of the object to be mapped are not correlated, or only to a minor extent, interference or points of interference that are not influenced by the rotation of the scan trajectories are strongly correlated and thus may be identified correspondingly well.

In a further embodiment, during the performance of the acquisition, at least one further individual acquisition takes place in which the scan start position is again rotated about an angle of rotation $\alpha$ in respect of the second individual acquisition, and from the at least one further individual acquisition at least one further image is captured, which, correspondingly rotated, is taken into consideration during the correlation. This means that not just two images are correlated with one another in order to detect RF interference, but at least three, four, or more images. In this way, it may be established even more reliably whether an image point reproduces the object to be recorded or represents interference.

In one development, the identification of the point of interference may take place using a pattern recognition algorithm. The correlation of the images may result in certain image points which form a known or established pattern. This type of pattern may be known as interference. The pattern recognition algorithm designed for this type of pattern may hence identify interference in this respect.

The identification of the point of interference may include a comparison with a threshold value. For example, if after the correlation the signal intensity at an interference point is higher than a threshold value because the image points in the respective images are correspondingly correlated, this is suggestive of a point of interference or interference or an RF interference source. Fewer correlated image points may lie below the threshold value and may not be registered as points of interference. A threshold value comparison (thresholding) such as this may be successful, because the signal intensity of the interference may be higher than the surrounding MR signal.

In a further exemplary embodiment, the correlation may be determined by a subtraction of images involved. Thus, in connection with the correlation, the individual images may be subtracted from one another following the rotation. A subtraction such as this makes structures visible which are located at the same positions in both images. Other image components which are moved toward one another during the rotation do not in contrast cancel one another out during the subtraction. In this respect, a correlation of the two images may be achieved by a simple subtraction.

The identification of the point of interference may be based on a machine learning algorithm, e.g., a deep-learning algorithm. In machine learning, a static model may be taken as the basis and may be trained using training data. An artificial neural network may be used in the deep-learning algorithm.

In accordance with a further exemplary embodiment, the point of interference in the images may be marked, deleted, or replaced. The point of interference may be marked so that the observer immediately recognizes that the observer cannot rely on this point of interference. In particular, the value of this point of interference may not be used for a diagnosis. Alternatively, the identified point of interference may be deleted. For example, it is hereby given the value zero and thus does not stand out as a result of high signal intensity. Further, alternatively, the point of interference may be replaced, e.g., the image point at the respect location is given a different signal value. Thus, for example, it may be given the average signal value of the image points which surround the point of interference.

Scanning in the magnetic resonance tomography system takes place during the acquisition along one or more trajectories. A trajectory such as this may in principle be configured arbitrarily. Advantageously, however, it is a spiral. A spiral-shaped k-space trajectory such as this does not possess any singularities and may easily be generated by sinusoidally oscillating rising or falling gradients. It allows the k-space to be passed through in a very short time and may be used for fast imaging, (e.g., in heart imaging).

Further in accordance with the disclosure, a computer program product may be provided which may be loaded directly into a memory of a control device of a magnetic resonance tomography system, with program code in order to execute the acts of the aforementioned method, when the program is executed in the control device of the magnetic resonance tomography system. The method described herein may also be present in the form of a computer program product which implements the method on a control unit when it is executed on the control unit. Likewise, an electronically readable data storage medium with electronically readable control information stored thereon may be present, which includes at least one described computer program product and is configured such that when the data storage medium is used in a control unit of an MR system it conducts a described method.

BRIEF DESCRIPTION OF THE DRAWINGS

The present disclosure will now be explained in greater detail using the attached drawings, in which:

FIG. 4 depicts a flow diagram of an exemplary embodiment of a method.

DETAILED DESCRIPTION

The present disclosure is based on the idea that no additional antennas and no RF room need be employed for the identification of RF interference. However, these components may be used supplementarily. In principle, however, it may be possible to identify the interference signal from data from the conventional MR coils.

Specifically, for example, an automatic identification of RF interference sources may take place in a sequence (for example, time-resolved) of spiral individual acquisitions (e.g., single-shot acquisitions), as is the case with faster time-resolved imaging in the interventional field or also in the MR fingerprinting method for generation of the images, on the basis of which the fingerprint is created. The aim of the present method is not to identify RF interference on the basis of unexpected blips, such as in the fingerprinting characteristic of a pixel, but to identify interference on the basis of the interference patterns throughout the image space and of their specific behavior above all in the case of spiral acquisitions.

Figure 1:
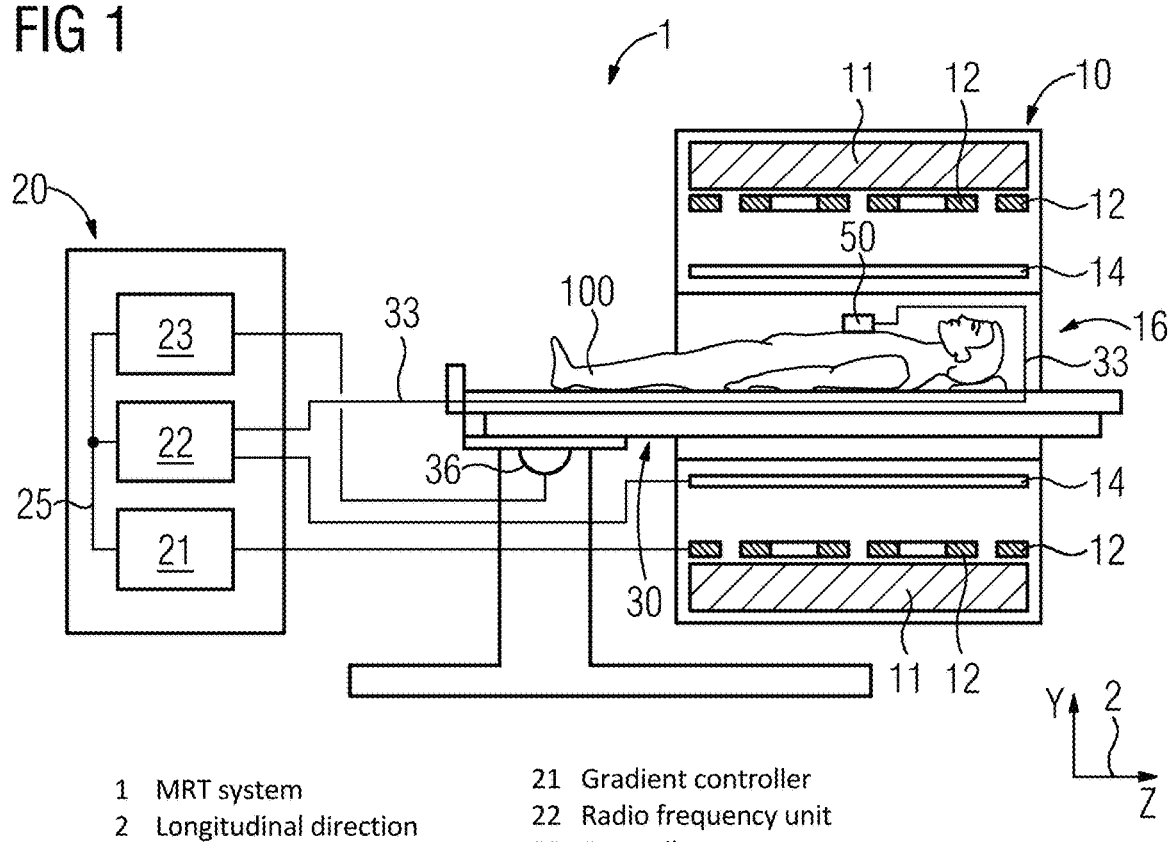
FIG. 1 depicts a schematic diagram of an example of a magnetic resonance tomography system.

FIG. 1 shows a schematic representation of an exemplary form of embodiment of an MRT system 1.

The MRT system 1 has a magnet unit 10 with a field magnet 11 which generates a static magnetic field for the alignment of nuclear spins in a sample, (e.g., of a patient 100), in an examination region or recording region. The recording region is characterized by an extremely homogenous static magnetic field, wherein the homogeneity relates in particular to the magnetic field strength or the magnitude thereof. The recording region may be almost spherical and positioned in a patient tunnel 16 extending in a longitudinal direction 2 through the magnet unit 10. The field magnet 11 may be a superconducting magnet which may provide magnetic fields with a magnetic flux density of up to 3 T or more. For lesser field strengths however, permanent magnets or electromagnets with normal conducting coils may be used. A patient couch 30 may be moved in the patient tunnel 16 by a positioning unit 36.

Furthermore, the magnet unit 10 has gradient coils 12, which for the spatial differentiation of the detected mapping regions in the recording region are configured to superimpose location-dependent magnetic fields over the static magnetic field in the three spatial directions. The gradient coils 12 may be configured as coils made of normal conducting wires, which may generate fields orthogonal to one another or field gradients in the recording region.

The magnet unit 10 may have a body coil 14 as a transmitting antenna, which is configured to emit a radio-frequency signal supplied via a signal line into the examination region. The body coil 14 may also be used in several forms of embodiment to receive resonance signals emitted by the patient 100 and to deliver them via a signal line. In such forms of embodiment, the body coil 14 may therefore serve as a main receiving antenna and as a transmitting antenna.

The MRT system 1 has a control unit 20 which may supply the magnet unit 10 with different signals for the gradient coils 12 and the body coil 14 and may evaluate the received signals. The control unit 20 may have a gradient controller 21 configured to feed the gradient coils 12 with variable currents via supply lines, the variable currents being able to provide the desired gradient fields in the examination region on a time-coordinated basis.

The control unit 20 may also have a radio-frequency unit 22 configured to generate radio-frequency pulses or excitation pulses with predetermined time characteristics, amplitudes, and spectral power distribution for the excitation of a magnetic resonance of the nuclear spins in the patient 100. In this case pulse powers in the kilowatt range may be employed. The excitation pulses may be radiated into the patient 20 via the body coil 14 or via one or more local transmitting antennas 33. The control unit 20 may also include a controller 23, which may communicate with the gradient controller 21 and the radio-frequency unit 22 via a signal bus 25.

A local coil 50, which may be connected to the radio-frequency unit 22 via a connection line 33, may optionally be arranged in the immediate environment of the patient 100, (e.g., on the patient 100 or in the patient couch 30). Depending on the form of embodiment, the local coil 50 may serve as a main receiving antenna alternatively or additionally to the body coil 14.

Whereas, in Cartesian MR acquisitions, RF interference sources in the image may be identified by individual points in the image or dotted lines in the image, they may be characterized in radial acquisitions by crossed dotted lines, similar to the radial spokes acquired in the k-space.

In spiral data acquisitions, the artifacts caused by the interference mostly also follow a spiral curve in the position space. In particular, they are also characterized in that they depend on the starting angle of the spiral and thus if the spiral rotates about an angle α in the k-space, as is frequently used in consecutive single-shot acquisitions, they also rotate about an angle of a in the k-space. Single-shot spirals permit the reconstruction of an identifiable image from items of data that are acquired in a very short period of time and quickly in series one after the other (e.g., a few ms in each case). Interference waves may have constant properties over this period of time.

In the following example, the aforementioned circumstances are exploited such that a selective search may be made for RF interference sources in a sequence of for example spiral single-shot acquisitions (individual acquisitions). Specifically, the angle of rotation between the individual acquisitions may be taken into account and the individual images correlated with one another.

Figure 2:
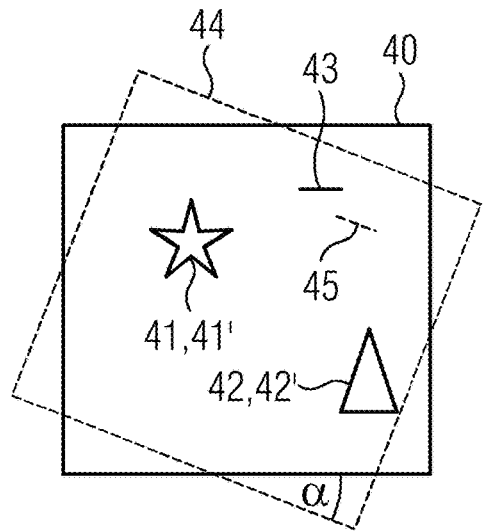
FIG. 2 depicts a schematic view of two acquired images, according to an embodiment.
Figure 3:
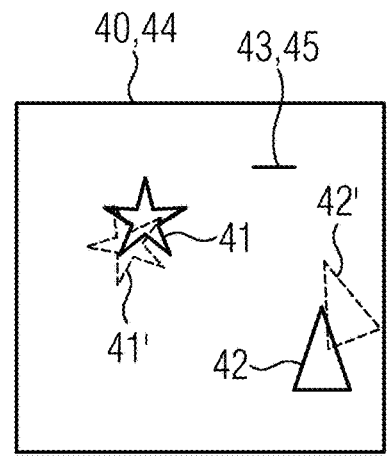
FIG. 3 depicts the two images from FIG. 2 rotated on top of one another, according to an embodiment.

FIGS. 2 and 3 show this procedure. In accordance with FIG. 2 a first individual acquisition is conducted in a first scan start position, from which a first image 40 results. This image 40 here contains a star 41 and a triangle 42. Both these image components 41 and 42 represent the object to be recorded and stand symbolically for individual components of the object. In the first image 40, which is here square, the star 41 is located at the top left and the triangle 42 at the bottom right. In addition, the first image 40 contains a linear artifact 43 at the top right, which is here aligned in parallel to the top edge of the first image 40. This artifact 43 arose as a result of RF interference in the present magnetic resonance tomography system.

In a subsequent second individual acquisition, which follows directly on from the first individual acquisition or after one or more intervening individual acquisitions, the trajectory is rotated about an angle $\alpha$. The scan start position is therefore rotated about this angle $\alpha$, such that a second image 44 is produced which is rotated about the angle $\alpha$ in respect of the first image 40. The individual components, namely the star 41 and the triangle 42, are unchanged in position, and the scan start position has merely rotated about the angle $\alpha$. Consequently, the corresponding image components 41' and 42' for the star and the triangle result in the image. These lie directly above the image components 41 and 42 of image 40.

In the second image 44, there is an artifact 45 located at the same relative position in the image 44 as the artifact 43 in the first image 40. This artifact 45 has the same linear structure and extent as the artifact 43 in the first image 40.

The second image 44, in accordance with FIG. 3, is now rotated about the angle of rotation $\alpha$ onto the first image 40. The image frames of both images 40, 44 therefore lie on top of one another. However, because of the rotation about the angle of rotation $\alpha$ the image components of the components of the object (star and triangle) of both the images rotate away from one another. Thus, the image component 41' of the second image 44 moves to bottom left compared to the image component 41 of the first image 40. Similarly, the image component 42' of the second image 44 moves to the top right compared to the image component 42 of the first image 40. This is because the individual components of the object are not stationary compared to the respective trajectory. In contrast, when the second image 44 is rotated onto the first image 40, the artifact 45 of the second image moves directly onto the artifact 43 of the first image. Both artifacts are thus congruent. A correlation of both the images 40 and 44 rotated on top of one another would therefore produce a high degree of concordance in the region of the artifacts 43, 45 and a low degree of concordance in the regions of the stars 41, 41' and the triangles 42, 42'. This is caused by the fact that the artifacts 43, 45 have a fixed relative position in their respective images 40, 44. The artifacts therefore possess the same image position. For this reason, the artifacts may be easily identified compared to other components in which the image position depends on the rotation.

FIG. 4 represents a flow diagram of an embodiment. In a first act S1, an acquisition takes place, in which scanning of the k-space along a trajectory takes place, wherein an angle of rotation $\alpha$ exists between a scan start position of a first individual acquisition and a scan start position of a following second individual acquisition. In particular, the acquisition may include a sequence of spiral single-shot acquisitions. This is characterized in that from individual acquisition to individual acquisition the starting angle of the spiral changes, e.g., by a constant angle $\alpha$.

In a second act S2, a first image 40 is obtained or generated from the first individual acquisition, and a second image 44 is obtained or generated from the second individual acquisition. To this end, the respective datasets of the individual acquisitions are processed using suitable image processing algorithms.

The two images 40 and 44 are now correlated. To this end, the two images 40, 44 are rotated in respect of one another about the angle $\alpha$ in act S3. The artifacts may occur in the form of dots, wherein the location of the dots in the image space depends on the respective trajectory of the scanner (for example a spiral). For example, if the starting angle of the spiral trajectory in the k-space changes, the points of interference change correspondingly in the image space. If the images 40, 44, which are now rotated about the angle $\alpha$ on top of one another, are correlated with one another, this results in high correlation values in the region of the artifacts, the relative image positions of which are unchanged in both images 40, 44. In other words, the points of interference of the artifacts are superimposed on one another. This is at least the case when the characteristic of the RF interference source between the at least two images 40, 44 does not change significantly.

In act S5, the superimposed points may be identified, in that for example a suitable pattern recognition algorithm is applied. However, for the identification of the artifacts brought about by the RF interference source a subtraction or a threshold value comparison of the images may also be applied, because the signal intensity of the interference sources may be higher than the surrounding MR signal. Alternatively, or additionally, machine learning or a deep-learning algorithm based on a neural network may be employed for the identification of the artifacts or RF interference sources.

Finally, in a further act S6, an identified point of interference may be marked, deleted or replaced in the images. This means that the identified points of interference in the image are either marked as interference points or for example are also deleted and replaced either by points with a predetermined value or are overwritten by interpolation of the surrounding points. In the case of an MR fingerprinting scan the identified points may be ignored in the fingerprinting comparison.

The method may be carried out over the entire scan. Hence in FIG. 4 it is possible to skip back from act S6 (if appropriate also from act S5) to act S1, as a result of which a sequence loop is produced. One example of an interruption criterion would be the end of the scan.

In a further form of embodiment, it may be possible to correlate not only consecutive images with one another, but any images in the series.

It is possible for the method to be used not directly for capturing an image, but as an additional scan—similar to an adjustment—for the identification of interference sources which change slowly over time. The use of other k-space trajectories as a replacement for spirals which are optimized for the identification of typical interference signals would then be conceivable.

For the performance of the aforementioned method for identifying RF interference in imaging, an exemplary magnetic resonance tomography system has a tomography device in accordance with FIG. 1 and an image processing device, which for example has a processor, with which the images may be captured and rotated and the correlation carried out.

In the case of time-resolved real-time imaging, the method may also be applied in real time when the computing power is available.

With the method proposed above, the identification of RF interference sources in image series of spiral individual acquisitions for example is enabled, in that the knowledge about the acquisition (here the starting angle of the spiral acquisition and the change therein over the image series and the resultant changing pattern of interference in the image space) is exploited. The advantage of this method is that it dispenses with further hardware, such as the pick-up antennas that may be required in connection with scans without an RF room, and so may be implemented inexpensively. However, it is also possible to execute the method in combination with previous approaches and thus to achieve an improvement in the entire interference suppression result.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for identifying radio frequency (RF) interference in imaging of a magnetic resonance tomography system, the method comprising:
    performing an acquisition, in which a scan of a k-space along a trajectory takes place, wherein an angle of rotation exists between a scan start position of a first individual acquisition and a scan start position of a second individual acquisition;
    obtaining a first image from the first individual acquisition;
    obtaining a second image from the second individual acquisition, such that the second image is rotated about the angle of rotation with respect to the first image;
    rotating one of the first or second images in respect of the other image about the angle of rotation such that image frames of the first image and the second image lie on top of one another to define overlapped images;
    determining a correlation between the one rotated image and the other image based on an artifact located in a same image position in the overlapped images; and
    identifying a point of RF interference from the correlation.

2. The method of claim 1, wherein, during the performing of the acquisition, at least one further individual acquisition takes place, in which a scan start position of the at least one further individual acquisition is rotated about an additional angle of rotation in respect of the second individual acquisition,
    wherein at least one further image is captured from the at least one further individual acquisition,
    wherein the at least one further image is rotated in respect of the second image about the additional angle of rotation, and
    wherein the at least one further rotated image is taken into account in the determining of the correlation.

3. The method of claim 2, wherein the identifying of the point of RF interference takes place using a pattern recognition algorithm.

4. The method of claim 2, wherein the identifying of the point of RF interference comprises a comparison with a threshold value.

5. The method of claim 2, wherein the identifying of the point of RF interference is based on a machine learning algorithm.

6. The method of claim 5, wherein the machine learning algorithm is a deep-learning algorithm.

7. The method of claim 2, further comprising:
    marking, deleting, or replacing the identified point of RF interference in the first image, the second image, and the at least one further image.

8. The method of claim 1, wherein the identifying of the point of RF interference takes place using a pattern recognition algorithm.

9. The method of claim 1, wherein the identifying of the point of RF interference comprises a comparison with a threshold value.

10. The method of claim 1, wherein the correlation is determined by a subtraction between the first image and the second image.

11. The method of claim 1, wherein the identifying of the point of RF interference is based on a machine learning algorithm.

12. The method of claim 11, wherein the machine learning algorithm is a deep-learning algorithm.

13. The method of claim 1, further comprising:
    marking, deleting, or replacing the identified point of RF interference in the first image and the second image.

14. The method of claim 1, wherein the trajectory, along which the scan takes place, is a spiral.

15. The method of claim 1, wherein the angle of rotation is less than 180°.

16. The method of claim 1, wherein the RF interference is an interference from an external source.

17. A non-transitory computer program product configured to be loaded directly into a memory of a control device of a magnetic resonance tomography system, wherein the computer program product, when executed in the control device of the magnetic resonance tomography system, is configured to cause the magnetic resonance tomography system to:
    perform an acquisition, in which a scan of a k-space along a trajectory takes place, wherein an angle of rotation exists between a scan start position of a first individual acquisition and a scan start position of a second individual acquisition;
    obtain a first image from the first individual acquisition;

obtain a second image from the second individual acquisition, such that the second image is rotated about the angle of rotation with respect to the first image;

rotate one of the first or second images in respect of the other image about the angle of rotation such that image frames of the first image and the second image lie on top of one another to define overlapped images;

determine a correlation between the one rotated image and the other image based on an artifact located in a same image position in the overlapped images; and identify a point of radio frequency (RF) interference from the correlation.

18. A magnetic resonance tomography system for identifying radio frequency (RF) interference in imaging, the system comprising:

a tomography device configured to perform an acquisition, in which a scan of a k-space takes place along a trajectory, wherein an angle of rotation exists between a first individual acquisition and a second individual acquisition; and an image processing device configured to:
  obtain a first image from the first individual acquisition;
  obtain a second image from the second individual acquisition, such that the second image is rotated about the angle of rotation with respect to the first image;
  rotate one of the first or second images in respect of the other image about the angle of rotation such that image frames of the first image and the second image lie on top of one another to define overlapped images;
  determine a correlation between the one rotated image and the other image based on an artifact located in a same image position in the overlapped images; and
  identify a point of RF interference from the correlation.

* * * * *